(12) United States Patent
Phatak et al.

(10) Patent No.: US 6,852,649 B1
(45) Date of Patent: Feb. 8, 2005

(54) MULTI-STEP HIGH DENSITY PLASMA (HDP) PROCESS TO OBTAIN UNIFORMLY DOPED INSULATING FILM

(75) Inventors: Prashant B. Phatak, Sunnyvale, CA (US); Frederick G. Eisenmann, III, Hudson, WI (US); Michal Fastow, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 257 days.

(21) Appl. No.: 09/823,839

(22) Filed: Mar. 30, 2001

(51) Int. Cl.[7] .................. H01L 21/31; H01L 21/469
(52) U.S. Cl. .................. 438/783; 438/778; 438/784; 438/787
(58) Field of Search .................. 438/583, 778, 438/783, 784, 914, 916, 925, 763, 787; 427/573, 579

(56) References Cited
U.S. PATENT DOCUMENTS

| | | | | |
|---|---|---|---|---|
| 4,376,672 A | * | 3/1983 | Wang et al. | 438/713 |
| 5,104,482 A | * | 4/1992 | Monkowski et al. | 438/698 |
| 5,807,792 A | * | 9/1998 | Ig et al. | 438/758 |
| 5,937,323 A | * | 8/1999 | Orczyk et al. | 438/624 |
| 6,077,764 A | * | 6/2000 | Sugiarto et al. | 438/597 |
| 6,100,202 A | * | 8/2000 | Lin et al. | 438/734 |
| 6,303,496 B1 | | 10/2001 | Yu | |
| 6,355,581 B1 | * | 3/2002 | Vassiliev et al. | 438/789 |
| 6,521,546 B1 | * | 2/2003 | Barnes et al. | 438/778 |
| 6,541,394 B1 | * | 4/2003 | Chen et al. | 438/770 |

* cited by examiner

Primary Examiner—Maria F. Guerrero
(74) Attorney, Agent, or Firm—Bradley T. Sako

(57) ABSTRACT

A method of forming an essentially uniform doped insulating layer is disclosed. Variations in a substrate temperature that may result in a dopant gradient within a doped insulating layer can be compensated for by varying a dopant supply rate in a deposition process. One particular embodiment discloses a method of forming a high density plasma phosphosilicate glass having a phosphorous concentration of 8% or greater by weight that varies by no more than about 1% by weight throughout.

16 Claims, 3 Drawing Sheets

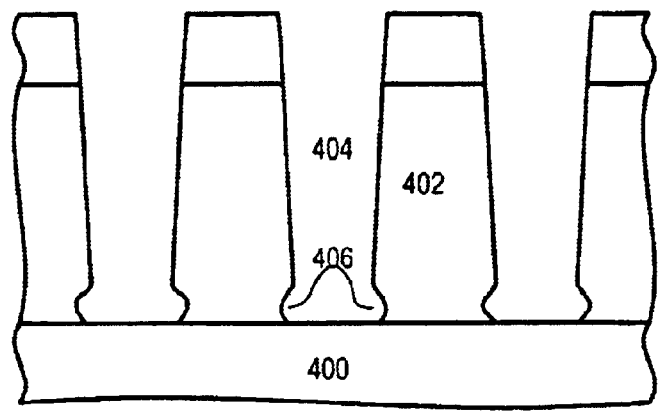
FIG. 4
(BACKGROUND ART)
| STEP TIME | OLD PROCESS | NEW PROCESS |
|---|---|---|
| 0-2 sec. | 40.5% | 30.9% |
| 2-4 sec. | 40.5% | 33.3% |
| 4-6 sec. | 40.5% | 35.7% |
| 6-8 sec. | 40.5% | 38.1% |
| Rest of Deposition | 40.5% | 40.5% |
FIG. 6
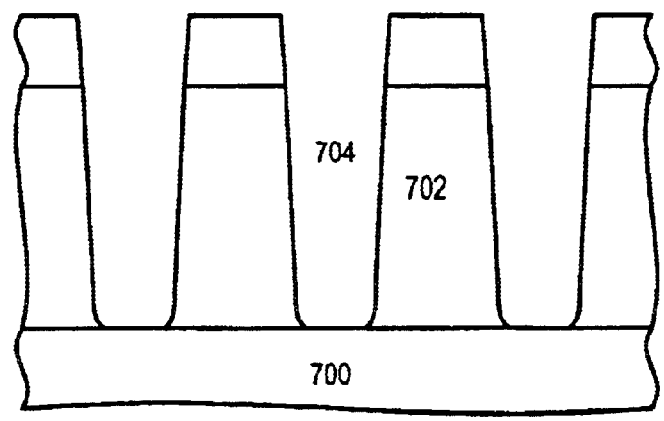
FIG. 7

MULTI-STEP HIGH DENSITY PLASMA (HDP) PROCESS TO OBTAIN UNIFORMLY DOPED INSULATING FILM

TECHNICAL FIELD

The present invention relates generally to the fabrication of semiconductor devices, and more particularly the formation of insulating materials doped with one or more impurities.

BACKGROUND OF THE INVENTION

Many types of integrated circuits are fabricated using layers of conductive, semiconductive, and/or insulating materials. For example, an integrated circuit may include a substrate in which a number of active devices (such as transistors) are formed. Such active devices are then connected to one another by one or more conductive or semiconductive layers (referred to herein as "conducting layers"). The interconnecting conducting layers are separated from one another by insulating layers. Insulating and conducting layers are typically deposited according to a predetermined deposition "recipe" which may define the various materials, conditions and environment used to deposit a layer.

An insulating layer may perform a variety of functions in an integrated circuit. For example, an insulating layer may serve to electrically isolate one conducting layer or structure from another. Such isolation includes both vertical isolation, typically between layers, and horizontal isolation, typically between conductive structures, such as contact structures.

A typical contact structure may include a contact and/or via is formed by etching a hole through one or more insulating layers, and then filling the hole with a conductive or semiconductive material. As integrated circuit density increases, contact structures may be situated closer to one another. Consequently, there is a need to form contact holes with controllable features.

A contact hole feature may depend upon the insulating material in which the contact hole is formed. An insulating material with desirable features may include a doped silicon oxide layer formed with a high density plasma. One approach to forming contact holes through a high density plasma insulating film is shown in commonly-owned, co-pending patent application Ser. No. 09/300,817, titled "Methods of Filling Constrained Spaces with Insulating Materials and/or Forming Contact Holes and/or Contacts in an Integrated Circuit" by Jengyi Yu (referred to herein as Yu). The contents of the patent application are incorporated by reference herein.

Doped silicon oxide films may provide advantageous step coverage and reflow properties over other insulating materials, including undoped silicon oxide. In many processes, a doped silicon oxide may be formed with a dopant source and a base material source. A dopant source may provide a dopant, such as boron or phosphorous, while a base material source may provide one or more of the elements of the material that is to be doped. In the case of silicon oxide, a base material source may provide silicon.

One concern with the formation of doped silicon oxide films can be the uniformity of doping within a layer. Lack of uniformity in doping may adversely affect other process steps. For example, for many silicon oxide etches, the rate at which silicon oxide is etched may vary according to doping concentration. In general, the higher the doping concentration, the higher the etch rate. Thus, if a contact hole is formed through an insulating layer having non-uniform doping, the higher doped regions may etch at a faster rate than lower doped regions. This may result in contact holes with walls having undercut regions. One particular example of such undercutting will now be described.

Referring now to FIG. 1, a response 100 is shown illustrating the doping concentration of a layer of phosphosilicate glass (PSG) formed a constant flow rate of source gases. More particularly, the example may result from a flow ratio of 40.5%, where the flow ratio is the ratio between a dopant source flow rate (e.g., phosphine $PH_3$) and base material source flow rate (silane $SiH_4$). Data values for a response 100 may be generated by a secondary mass ion spectrometry (SIMS) profile. As response 100 shows, a PSG layer may have an essentially uniform doping from a top surface of a PSG layer (0 $\mu$m depth) to a depth of about 0.4 $\mu$m. However, from a depth greater than 0.4 $\mu$m to a substrate surface (0.6 $\mu$m depth), a PSG doping concentration may increase.

It is understood that the graph of FIG. 1 may represent a dopant concentration as portions of a PSG layer are removed, beginning at a top surface. Thus, a substrate is understood to exist at a depth of about 0.6 microns. An initial 0.2 micron thickness of the PSG layer is at a depth of about 0.6 microns to 0.4 microns. An initial 0.4 microns thickness is understood to be at a depth of about 0.6 microns to 0.2 microns.

Thus, as shown in response 100 of FIG. 1, despite a uniform source gas ratio, non-uniformity can result. It is believed that such non-uniformity in a PSG film can be related to variations in substrate temperature. As but one example, FIG. 2 shows a response 200 illustrating a substrate temperature during the deposition of a high density plasma (HDP) PSG film. As shown in response 200, prior to deposition (time 0–100), a substrate may have a certain temperature (330° C.). However, as the deposition process proceeds, a substrate temperature may rise.

As shown in FIG. 3, for a given source gas flow rate, variations in temperature can result in variations in doping concentration. More particularly, FIG. 3 includes a response 300 that shows how doping concentration may go down as temperature increases.

As noted above, a higher doping concentration in one portion of an insulating layer may result in undercutting in a wall of contact hole. FIG. 4 shows a side cross sectional view of a contact formed in an insulating layer having a doping concentration gradient. More particularly, FIG. 4 shows a substrate 400 on which an insulating layer 402 is formed. An insulating layer 402 may have a doping concentration with a gradient. The gradient may include a doping concentration that increases near the surface of a substrate 400. Such a gradient may be represented by response 100 in FIG. 1.

A contact hole 404 may be etched through an insulating layer 402 having a non-uniform doping. As also noted above, regions having a higher level of doping may etch at a faster rate than regions of lower doping, especially during wet chemical processing following a contact hole formation. Consequently, a contact hole 404 may include an undercut formation 406 ("foot"). An undercut formation 406 may complicate subsequent manufacturing of an integrated circuit and/or lead to defects. As but one example, if a contact hole 404 is filled with a conductive material, and undercutting is severe enough, such a material may form a short circuit with an adjacent conductive structure.

In light of the conventional approach set forth above, it would be desirable to arrive at some way of forming an insulating material having a uniform doping concentration on a substrate with a varying temperature.

SUMMARY OF THE INVENTION

According to the disclosed embodiments of the invention, a method of forming an insulating film may include varying a dopant supply rate to compensate for a dopant gradient that may arise when a constant dopant supply rate is used.

According to one aspect of the embodiments, an insulating film may be formed over a substrate that may have a varying temperature, and a dopant supply rate may vary according to a substrate temperature.

According to another aspect of the embodiment, an insulating film may comprise doped silicon dioxide, more particularly, silicon dioxide with a phosphorous concentration greater than 7% by weight.

According to another aspect of the embodiment, an insulating film may be formed with a high density plasma. More particularly, an insulating film may comprise high density plasma phosphosilicate glass.

According to another aspect of the embodiment, a dopant can be supplied over different periods of time with the dopant supply rate being different for at least two time periods.

According to another aspect of the embodiment, a dopant supply rate may be varied for one period of time and then maintained at a constant rate for another period of time.

According to another aspect of the embodiment, an insulating film may include a dopant supply and a base material supply. Varying a dopant supply rate may include varying a supply ratio, where the supply ratio includes a dopant supply rate divided by the dopant supply rate added to a base material supply rate.

BRIEF DESCRIPTION OF THE DRAWINGS

FIG. 4 is a side cross sectional view of a contact hole formed in an insulating layer having non-uniform doping.

FIG. 6 is a table showing a method of forming an HDP PSG layer with a constant dopant source rate and a method according to one embodiment.

FIG. 7 is a side cross sectional view of a contact hole formed in a dielectric layer according to one embodiment.

DETAILED DESCRIPTION OF THE EMBODIMENTS

Various embodiments will now be described in conjunction with a number of charts and diagrams. The embodiments set forth approaches to forming an insulating material having essentially uniform doping on a substrate, while the temperature of the substrate varies. In one particular embodiment, flow rates of source gases can be varied to compensate for the effect of substrate temperature on dopant concentration.

Figure 5:
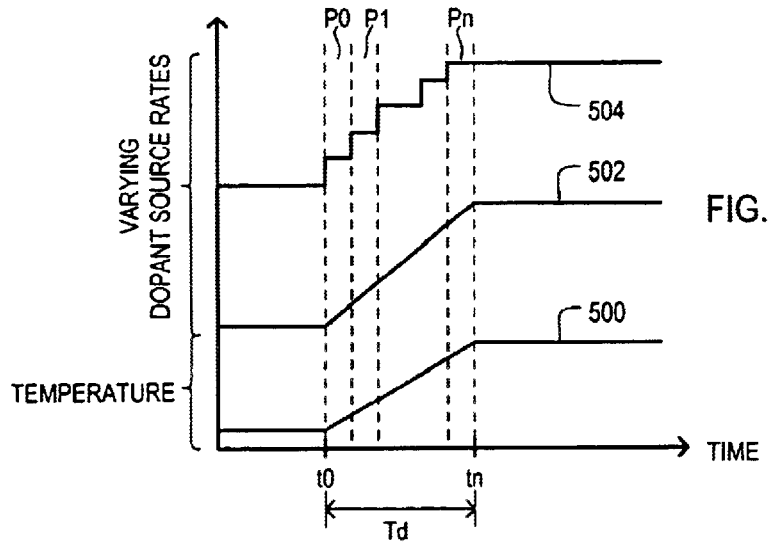
FIG. 5 is a graph illustrating methods according to one embodiment.

FIG. 5 is graph that includes a curve 500 that represents a temperature variation of a substrate during an insulating layer deposition process. Corresponding to the temperature curve 500 is a continuously varying dopant supply rate curve 502 and a stepped dopant supply rate curve 504. As shown in FIG. 5, a substrate temperature may have a first temperature at a time t0. A substrate temperature may then vary (e.g., rise, fall or some mixture thereof) over a time period Td. According to the present invention, as a substrate temperature varies, a dopant supply rate can vary in a compensating fashion (e.g., increase, decrease or some variation thereof). As but one example, if an increase in temperature can result in lower concentration levels, a dopant source material supply rate can increase in time period Td.

A dopant source material supply rate may vary in a number of ways. For example, a supply rate may vary continuously throughout a temperature change period Td, as shown by curve 502. However, such a rate a change may be difficult to accomplish, or be overly complex when implemented with some types of deposition equipment. Consequently, according to one embodiment, a dopant source material supply rate may vary in a step-wise fashion over discrete periods of time, as shown in curve 504. For example, referring once again to FIG. 5, a temperature change period Td may be divided into time periods P0 to Pn. Such time periods may be the same, or may differ from one another depending upon a gradient that is being compensated for.

While a dopant source supply rate may be expressed as a single supply rate, such a supply rate may also be expressed as a ratio or percentage between a dopant source and other material sources. For example, in the formation of an insulating material, multiple source materials can be supplied, with each such source material having its own supply rate. Thus, an insulating material may be formed with a dopant source and a base material source. As but one particular example, the formation of phosphosilicate glass (PSG) may include a base material source of silane ($SiH_4$) (a source of silicon), and a dopant source of phosphine ($PH_3$) (a source of phosphorous).

As temperature varies, a ratio between a dopant source rate and other materials can vary accordingly. As but one example, a dopant source supply rate may be expressed as the ratio of (dopant source rate)/[(dopant source rate)+(base material source rate)].

In one very particular example, dopant and base material sources may be gases, and the rates may be rates at which a gas is supplied to a reactor chamber.

While the present invention may have a variety of applications, one particular application can be providing uniform doping in an insulating layer formed with a high density plasma.

Figure 2:
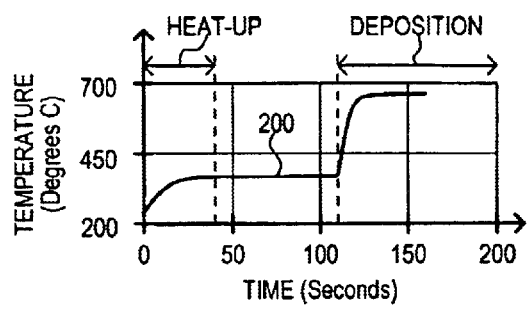
FIG. 2 is a graph that shows a substrate temperature during a high density plasma (HDP) phosphosilicate glass (PSG) deposition.
Figure 3:
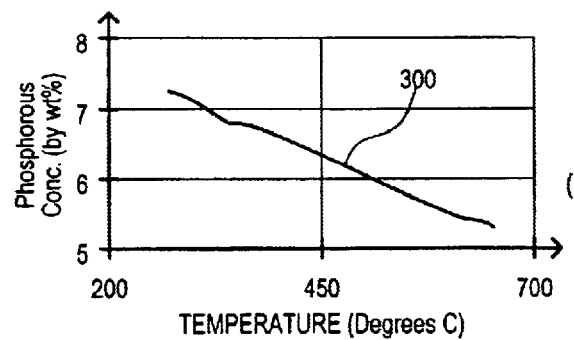
FIG. 3 is a graph showing doping concentration versus temperature for a constant dopant source gas flow ratio.

High density plasma insulating layers may have the various advantages described in Yu, cited and incorporated by reference above. In some applications, however, high density plasma deposition may result in a substrate temperature variation, such as that shown in FIG. 2. Consequently, depositing a doped insulating layer with a high density plasma may form a dopant gradient. Thus, according to one embodiment, a dopant source supply rate to a high density plasma reactor chamber may be varied to compensate for resulting temperature variations.

While high density plasma deposited insulating films may benefit from the present invention, as also noted in Yu, high density plasma deposited phosphosilicate glass (HDP PSG) may have particularly advantageous properties in the fabrication of semiconductor devices. In particular, a layer of HDP PSG having a high concentration of phosphorous, relative to other conventional approaches, may provide numerous advantages. Accordingly, in one very particular embodiment, a phosphorous dopant source supply rate may be varied to compensate for temperature variations in the formation a HDP PSG having a relatively high concentration of phosphorous. A relatively high concentration of phosphorous may include greater than about 7% by weight, more particularly about 8–10%.

Referring now to FIG. 6, a table is set forth contrasting a method of forming HDP PSG with a constant dopant source flow rate to one embodiment that varies such a rate. In the particular approach of FIG. 6, dopant source flow rates may be varied in a step wise fashion over particular periods of time. Time periods are shown in first column "STEP TIME". A constant flow approach is shown in a column "OLD PROCESS". It is understood that the approach illustrated by the OLD PROCESS column is provided to show a constant flow rate, and is not meant to imply such a process is necessarily prior art. A third column "NEW PROCESS" shows one particular embodiment.

The embodiment shown in FIG. 6 may form HDP PSG with a phosphorous source (a dopant source) and a silicon source (a base material source). Relative flow rates between the sources are expressed as the ratio (i.e., percentage) noted above. More particularly, the percentages of FIG. 6 correspond to a flow rate ratio of $(PH_3)/(PH_3+SiH_4)$.

Figure 1:
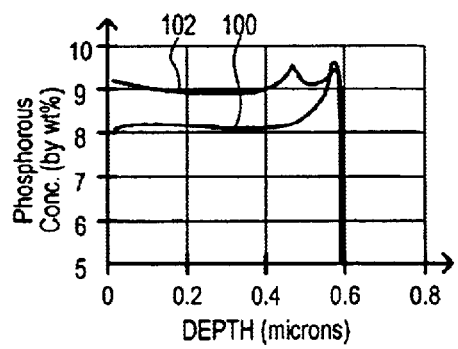
FIG. 1 is a graph showing doping concentration for a conventional method and a method according to one embodiment.

Referring now to FIG. 6, it is noted that a ratio of 40.5% may provide a desired phosphorous concentration (in this example, about 9% by weight) after a temperature has stabilized. However, due to a particular HDP deposition process, a substrate temperature may vary over an initial time period of the deposition (in this example, the first eight seconds). Accordingly, the OLD PROCESS setting may result in a dopant gradient and subsequent undesirable etch effects illustrated in FIGS. 1 and 4.

To compensate for such variation, a temperature varying period may be divided into time periods (in the example, four periods of two seconds each). In each time period, a ratio may be adjusted to compensate for temperature effects on doping concentration. In the example of FIG. 6, lower temperatures may result in higher phosphorous concentrations. Consequently, an increasing doping gradient that would result from a constant ratio can be compensated for starting at a lower ratio value (30.9% versus 40.5%), and stepping up such a lower ratio value in each consecutive time period.

FIG. 6 also shows how a deposition process and/or a doped insulating film may include more than one portion. During a first 8 seconds, a deposition process may include varying a dopant source rate. An insulating film formed during this time period may be conceptualized as first portion of an insulating film. However, during a subsequent time period, a dopant source rate may have a constant dopant source rate. An insulating film formed during this time period may be conceptualized as a second portion of an insulating film.

It is noted that FIG. 6 shows a linear increase in ratio values over the given time periods. Such an approach may provide an easily implemented solution to a gradient problem. However, as noted above, alternate embodiments and/or applications may include nonlinear ratio/flow rate variations depending upon a particular gradient that is being compensated for.

In the particular embodiment of FIG. 6, each time period can correspond to a thickness of about 200 Å. Therefore, a supply rate ratio of 30.9% may correspond to an initial thickness of about 200 Å. Further, supply rate ratios of 30.9%, 33.3% and 35.7% may correspond to an initial thickness of about 600 Å.

Referring back to FIG. 1, a response 100 may represent a phosphorous doping profile resulting from a constant flow rate, such as that set forth in the OLD PROCESS column of FIG. 6. In contrast, response 102 may illustrate the doping concentration of a layer of phosphosilicate glass (PSG) formed with a varying flow rate as set forth in the NEW PROCESS column of FIG. 6. As shown, a method according to the embodiment of FIG. 6 may provide a more uniform doping concentration over an entire thickness of a HDP PSG film than a constant dopant flow rate approach. In particular, a phosphorous concentration may be greater than 7% by weight, and at the same time vary by no more than 1% by weight throughout the PSG layer.

Referring back to FIG. 4, a contact hole 404 having an undercut formation 406 may result from etching an HDP PSG film formed according to the OLD PROCESS flow rate ratio of FIG. 6. In contrast, FIG. 7 shows a resulting contact hole that may result from etching an HDP PSG film formed according the NEW PROCESS flow rate ratios of FIG. 6.

More particularly, FIG. 7 shows a substrate 700 on which an insulating layer 702 is formed with a high density plasma deposition. An insulating layer 702 may have a doping concentration that compensates for a dopant gradient that could result from a substrate temperature variations. Such a doping concentration may be represented by a response 102 in FIG. 1.

A contact hole 704 may be etched through an insulating layer 702. Due to an improved doping profile, a contact hole 704 may not include an undercut formation, such as those shown as 406 in FIG. 4.

Control of dopant supply rates and/or supply rate ratios may take a variety of forms. If temperature variations are predictable for a given process step, changes in flow rates may programmed to change over time. Alternatively, an equipment operator may change flow rates at certain times and/or according temperature readings. Still further, flow rate equipment may include an active temperature feedback loop that can increase/decrease supply rate according to temperature readings.

One example of an active temperature feedback loop is shown in FIG. 9 and designated by the general reference character 800. A system 800 may include one or more source materials 802-0 and 802-1 that may be supplied to a reaction chamber 804. A source material (802-0 and 802-1) may include, as but one example, gases for depositing a layer on a wafer. Such source materials may include one or more dopant sources and one or more base material souces. A reaction chamber 804 may comprise a deposition chamber that holds one or more wafers for manufacturing semiconductor devices.

The rate at which source materials (802-0 and 802-1) can be supplied to a reaction chamber 804 can be controlled by flow controllers 806-0 and 806-1. Controllers (806-0 and 806-1) may include adjustable gas flow valves, for example, that may provide a supply rate according to an input signal.

Input signals for flow controllers (806-0 and 806-1) may be generated by converters (808-0 and 808-1). Converters (808-0 and 808-1) may generate input signals in response to a temperature signal provided by a sensor 810 for a reaction chamber 802. A sensor 810 may provide a signal indicating a manufacturing variable within a reaction chamber 802. As but one example, a sensor 810 may provide a signal that indicates a wafer substrate temperature.

Figure 8:
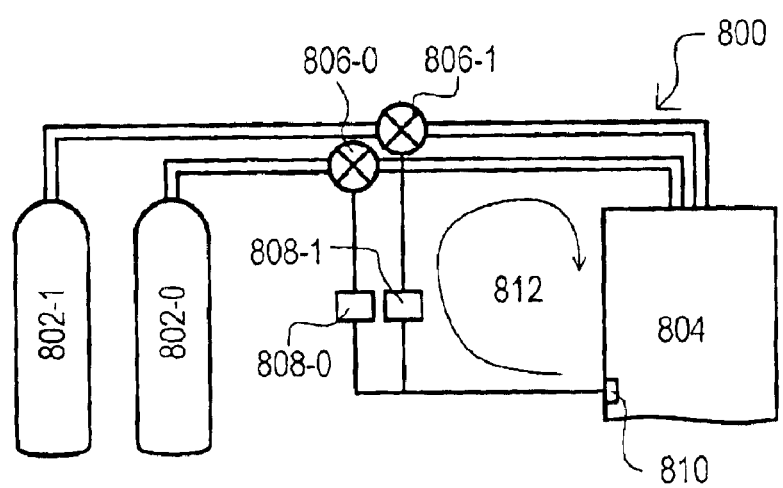
FIG. 8 is a diagram showing closed loop control of a dopant/dopant ratio rate according to one embodiment.

In one particular arrangement, a system 800 may provide for closed loop control of a dopant supply rate. Such a closed loop is shown as item 812 in FIG. 8. In one very particular embodiment, a closed loop 812 may include active reaction chamber temperature feedback provided by a sensor 810. Of course, the example of FIG. 8 is but one example of a closed loop control arrangement, and so should not be construed as limiting the invention thereto.

One skilled in the art would recognize that the above descriptions have illustrated but particular approaches to varying a dopant supply rate and/or compensating for an undesirable dopant gradient. Thus, the present invention may include alternate embodiments that include different dopants and/or mixtures of dopants, and/or embodiments that compensate for dopant gradients arising for various reasons other than a changing substrate temperature.

Thus, while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method comprising:

varying a dopant supply rate for a doped insulating layer according to a variation in temperature of a substrate on which the doped insulating layer is being formed; and varying the dopant supply rate includes increasing the dopant supply rate as the substrate temperature increases.

2. The method of claim 1, wherein:

the doped insulating layer is formed with a high density plasma deposition process.

3. The method of claim 1, wherein:

the doped insulating layer comprises phosphosilicate glass.

4. The method of claim 1, wherein:

varying the dopant supply rate includes providing different dopant supply rates for different time periods.

5. The method of claim 1, further including:

etching a contact hole through the doped insulating layer to the substrate.

6. The method of claim 1, further including:

varying the dopant supply rate over a first period of time and maintaining a constant dopant supply rate for a second period of time.

7. The method of claim 4, wherein:

the different time periods include a plurality of time periods of the same length, the dopant supply rate being different during at least two of the time periods.

8. The method of claim 5, wherein:

the doped insulating layer comprises phosphosilicate glass having a phosphorous dopant concentration of greater than about 6% by weight.

9. The method of claim 6, wherein:

the first period of time precedes the second period of time.

10. A method, comprising:

compensating for a temperature dependent dopant gradient in a doped insulating film comprising silicon oxide having a phosphorous concentration greater than about 7% by weight, by varying a dopant supply rate as the doped insulating film is formed; wherein the dopant supply rate is varied for an initial thickness of the doped insulation film to compensate for variations in a substrate temperature.

11. The method of claim 10, wherein:

the initial thickness is no more than 0.8 microns.

12. The method of claim 10, wherein:

the initial thickness is no more than 0.4 microns.

13. The method of claim 10, further including:

varying the dopant supply rate for a first portion of the insulating film and maintaining a constant dopant supply rate for a second portion of the insulating film.

14. The method of claim 10, further including:

varying the dopant supply rate includes closed loop control of dopant source supply rate with active temperature feedback from a reaction chamber.

15. The method of claim 10, wherein:

varying the dopant supply rate includes altering a supply rate ratio given by a dopant source supply rate divided by the dopant source supply rate plus a base material source supply rate.

16. The method of claim 15, wherein:

the dopant source supply rate includes a flow rate for a source of phosphorous, the base material source supply rate includes a flow rate for a source of silicon, and the supply rate ratio varies from about 30% to 45%.

* * * * *